United States Patent [19]

Mecherle

[11] Patent Number: 4,989,212
[45] Date of Patent: Jan. 29, 1991

[54] LASER DIODE PHASE MODULATION TECHNIQUE

[75] Inventor: George S. Mecherle, Hawthorne, Calif.

[73] Assignee: TRW, Inc., Redondo Beach, Calif.

[21] Appl. No.: 506,637

[22] Filed: Apr. 9, 1990

[51] Int. Cl.$^5$ .............................................. H01S 3/10
[52] U.S. Cl. ...................................... 372/26; 372/28; 455/611
[58] Field of Search ................... 372/26, 28; 455/608, 455/611, 613, 619, 609

[56] References Cited

U.S. PATENT DOCUMENTS

| | | | |
|---|---|---|---|
| 3,699,445 | 10/1972 | Kinsel | 325/30 |
| 4,009,385 | 2/1977 | Sell | 250/199 |
| 4,149,071 | 4/1979 | Nagai et al. | 250/199 |
| 4,443,890 | 4/1984 | Eumurian | 455/613 |
| 4,471,494 | 9/1984 | Keil et al. | 455/611 |
| 4,546,458 | 10/1985 | Cielo et al. | 367/149 |
| 4,700,352 | 10/1987 | Shikada et al. | 372/26 |
| 4,723,310 | 2/1988 | De Corlieu et al. | 455/608 |
| 4,723,314 | 2/1988 | Schneeberger | 455/619 |
| 4,723,316 | 2/1988 | Glance | 455/619 |
| 4,723,317 | 2/1988 | Glance | 455/619 |
| 4,751,745 | 6/1988 | Price | 455/619 |
| 4,759,080 | 7/1988 | Emura et al. | 455/617 |
| 4,783,852 | 11/1988 | Auracher | 455/619 |
| 4,805,235 | 2/1989 | Henmi | 455/608 |
| 4,819,240 | 4/1989 | Takiguchi et al. | 372/26 |
| 4,884,278 | 11/1989 | Nishimoto et al. | 372/26 |
| 4,924,470 | 5/1990 | Ries | 372/26 |

Primary Examiner—Léon Scott, Jr.
Attorney, Agent, or Firm—Noel F. Heal; Ronald L. Taylor

[57] ABSTRACT

Apparatus, and a corresponding method, for phase-modulating an optical carrier signal. An input data signal is passed through a derivative filter to obtain a time-differentiated data signal, for application directly to a laser diode, which functions inherently as a frequency modulator. The carrier signal is frequency-modulated by the time derivative of the input signal, and this is equivalent to being phase-modulated by the input signal.

8 Claims, 7 Drawing Sheets

LASER DIODE PHASE MODULATION TECHNIQUE

BACKGROUND OF THE INVENTION

This invention relates generally to optical communication systems and, more particularly, to techniques for phase modulation of an optical carrier signal. The established method for phase modulation of optical signals in a phase-shift-keying (PSK) modulation system is to use an electro-optical (EO) modulator with a polarizer. The EO modulator method employs a property of modulation theory: that a double sideband suppressed carrier (DSB-SC) signal, obtained by ampliponent, modulation by $\pm 1$ with a supressed carrier component is equivalent to shifting the carrier $\pm \pi 2$ in phase. Thus, phase modulation can be obtained by amplitude-modulating the carrier and ensuring that the carrier frequency component is suppressed.

Another known method of phase modulation of laser diodes avoids the use of an EP modulator and involves injection locking with a second laser diode. This was described in Electronics Letters, 18, 5, pp. 210-22, 1982. However, this method requires two laser diodes and is limited to modulation bandwidths less than half of the injection locking bandwidth. Moreover, it has complexities associated with maintaining injection locking of the two laser diodes.

The use of PSK for modulation of optical signals has approximately a 6 dB (decibels) advantage over FSK (frequency shift keying), but the use of an EO modulator imposes a penalty of approximately 3-4 dB, which practically negates this advantage. Further, the use of an EO modulator poses additional problems of reduced reliability, and increased bulk and weight, all of which are of concern in many applications.

It will be appreciated from the foregoing that there is still a significant need for an alternative approach to direct phase modulation of laser diodes used in optical communication systems. The present invention is directed to this end.

SUMMARY OF THE INVENTION

The present invention resides in apparatus, and a related method, for direct phase modulation of a laser diode, without the use of an electro-optical modulator. Briefly, and in general terms, the method of the present invention comprises the steps of inputting a time-varying data signal to be used as a modulating signal, differentiating the data signal with respect to time, generating an optical carrier signal in a laser diode, and modulating the optical carrier signal with the time-differentiated data signal, whereby the laser diode operates to frequency-modulate the time-differentiated data signal, which is equivalent to phase modulation of the data signal.

The method also includes the step of equalizing the differentiated data signal prior to the modulating step, to compensate for nonlinearities in operation of the laser diode as a frequency modulator.

In terms of novel apparatus, the invention comprises a laser diode, for generating an optical carrier signal, a derivative filter connected to receive a data signal as input, and constructed to produce an output signal proportional to the time derivative of the input data signal, and means for coupling the derivative filter output signal to the laser diode, wherein the laser diode functions as a frequency modulator and produces a modulated optical carrier signal that is modulated in phase in accordance with variations in the input data signal.

The phase modulation apparatus also comprises an equalizing filter connected between the derivative filter and the laser diode, to compensate for nonlinearities in operation of the laser diode as a frequency modulator.

It will be appreciated from the foregoing that the present invention represents a significant advance in the field of optical communication systems. In particular, the invention provides a more efficient technique for direct phase modulation of an optical signal. Other aspects and advantages of the invention will become apparent from the following more detailed description, taken in conjunction with the accompanying drawings.

BRIEF DESCRIPTION OF THE DRAWINGS

FIG. 3b is the magnitude spectrum of the signal shown in FIG. 3a;

FIG. 5b is the magnitude spectrum of the signal shown in FIG. 5a;

FIG. 6b is the magnitude spectrum of the signal shown in FIG. 6a;

FIG. 7b is the magnitude spectrum of the signal shown in FIG. 7a;

FIG. 8b is the magnitude spectrum of the signal shown in FIG. 8a.

DESCRIPTION OF THE PREFERRED EMBODIMENT

Figure 1:
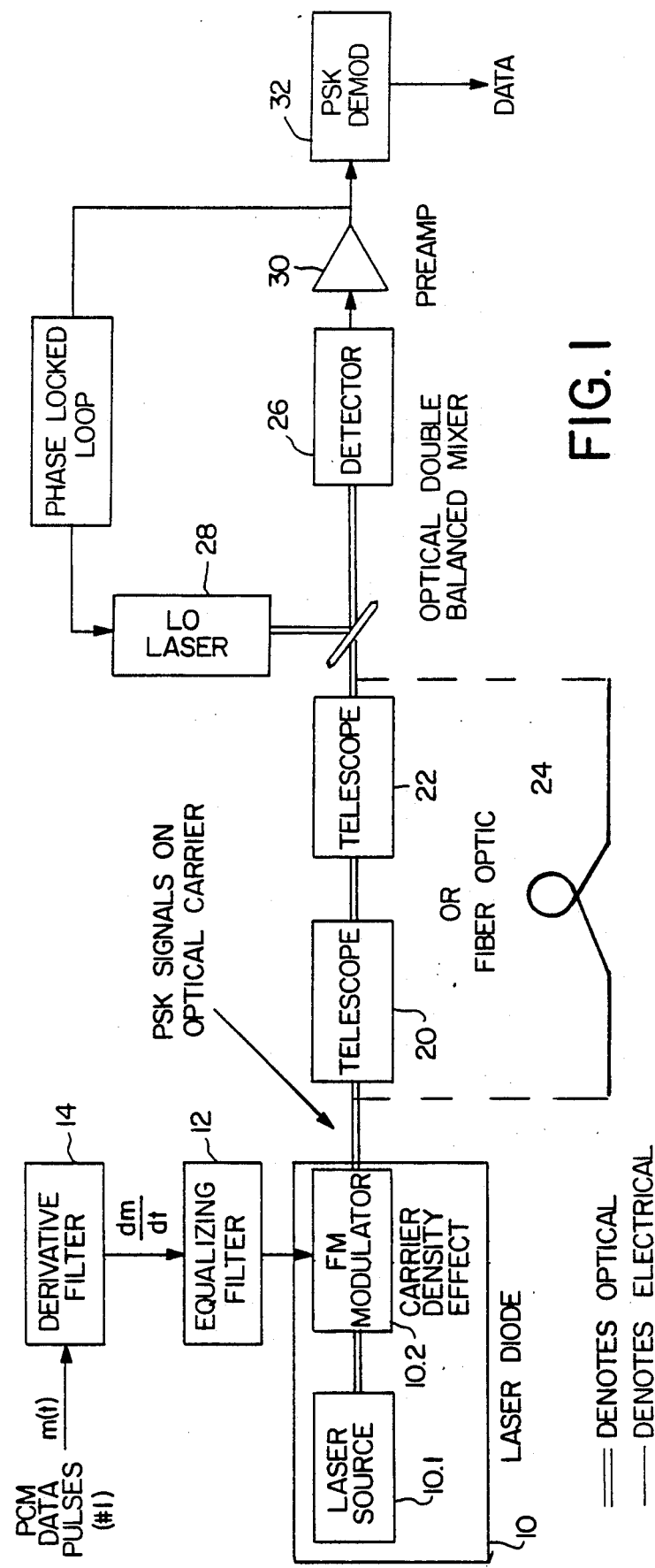
FIG. 1 is a block diagram of an optical homodyne PSK system employing the phase modulation technique of the present invention.

As shown in the drawings for purposes of illustration, the present invention is concerned with techniques for direct phase modulation of laser diodes. Phase modulation of laser diodes can be usefully employed in optical communications systems. In the past, phase modulation has been effected by means of electro-optical modulators, or by relatively complex techniques employing two injection locked laser diodes.

In accordance with the invention, a laser diode is directly modulated in phase by a data signal. The invention may be considered the combination of two properties from different fields. One is a known property of laser diodes: that they will inherently operate as frequency modulators. This is a result of two physical effects observable in laser diodes, which cause their operating frequencies to change with changes in injection current. One is a thermal effect at low modulation frequencies. This causes changes in frequency of several gigahertz per milliampere of injection current change (GHz/mA), at modulation frequencies below a few megahertz (MHz). The thermal effect is due to heating of the device by electrical resistive losses, which changes the refractive index of material inside the laser cavity. This, in turn, changes the effective cavity length and therefore its lasing frequency. The other physical effect causing changes in frequency is a carrier density effect at high modulation frequencies. This causes changes in frequency of several hundred MHz/mA over a modulation range from a few MHz to a multiple GHz. The carrier density effect is due to variations in the refractive index of material inside the laser diode, with variations in the number of charge carriers.

The other property employed in the invention is a known relationship between frequency modulation and phase modulation. Both are forms of angle modulation, and, since the frequency is basically the time differential of the angle, they differ only in the presence or absence of a time integral or a time differential term. In simple mathematical terms, frequency modulation may be expressed as:

$$c(t) = A \cos[\omega_c t + \Delta_\omega \int m(t) dt + \Psi],$$

and a phase modulated carrier has the form:

$$c(t) = A \cos[\omega_c t + \Delta m(t) + \Psi],$$

where
A = the carrier amplitude, $\omega_c$ = carrier frequency,
m(t) = signal modulation,
$\Delta_\omega$ = frequency deviation coeff. (rps/volt),
$\Delta$ = phase modulation index (radians/volt),
$\Psi$ = carrier phase.

From the above expressions, it might be deduced that, if the time derivative of m(t), referred to as m'(t), were input to an FM modulator, the inherent integration of the FM modulator would cancel an initial "prebiasing" of the input signal by time differentiation. This property has been known for some time. See, for example, a text by Carlson, Communication Systems, p. 223 (1975), in which it is stated that integrating and differentiating networks can be used to convert a phase modulator to a frequency modulator, and vice versa.

The optical phase modulator of the invention has only three components: a laser diode, indicated by reference numeral 10, an equalizing filter 12 and a derivative filter 14. As discussed above, the laser diode is inherently a frequency modulator, and may be illustrated as comprising a laser light source 10.1 and a frequency modulator 10.2. Because of the thermal effect and the optical carrier effect described above, the frequency modulation effected by the laser diode 10 is not perfectly linear over a range of modulation frequencies of interest. Greatly improved linearity can be obtained by means of the equalizing filter 12, which is of simple passive resistance and capacitance (RC) design. The derivative filter 14 provides a time derivative dm/dt of the input signal m(t), and this is applied to the laser diode 10 through the equalizing filter 12. As a result, frequency modulation of the differentiated input signal produces an output signal in which the carrier signal is phase modulated by the input signal m(t).

The remainder of FIG. 1 is of interest only for its depiction of a complete communications system employing the invention. The resulting PSK signals may be transmitted though a sending telescope 20 and a receiving telescope 22, or through an optical fiber 24, depending on application requirements. At a receiving end of the system, a PSK modulated carrier signal is input to a detector 26, together with an optical signal from a local-oscillator laser 28. The detector produces a corresponding electrical signal resulting from optical demodulation of the incoming optical carrier signal. This electrical PSK signal is amplified in preamplifier 30, and then passed to a PSK demodulator 32, which decodes the data in the PSK signal.

The derivative filter 14 may take any convenient form. When the input signals are digital PSK modulating signals, the filter 14 may conveniently take the form of a finite impulse response (FIR) filter like the one shown in FIG. 4. However, the invention is not limited to a particular implementation of the derivative filter, nor to a phase modulator that uses a phase shift keying (PSK) data modulation scheme.

Figure 2:
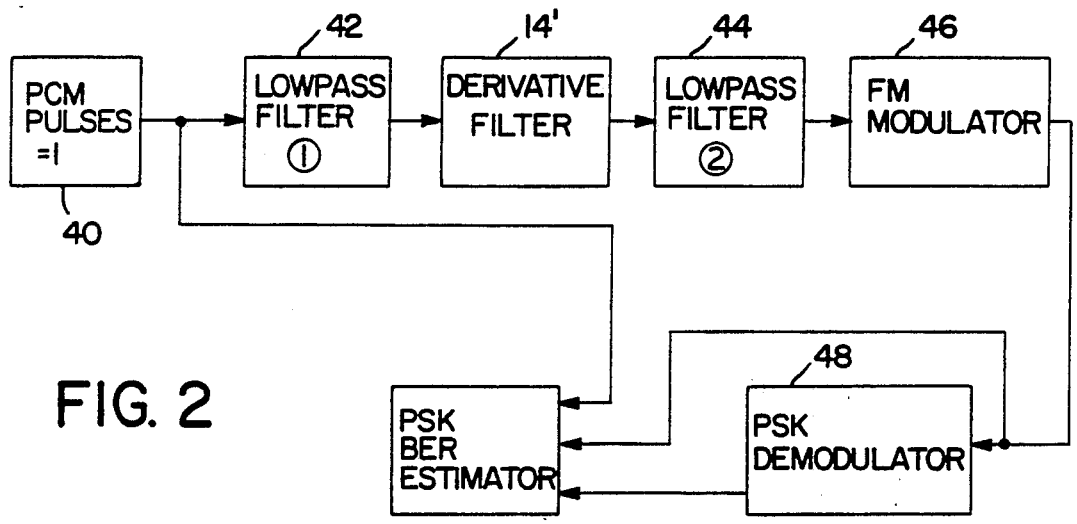
FIG. 2 is a simplified block diagram of a computer simulation model used to test the principle of the invention.
Figure 3A:
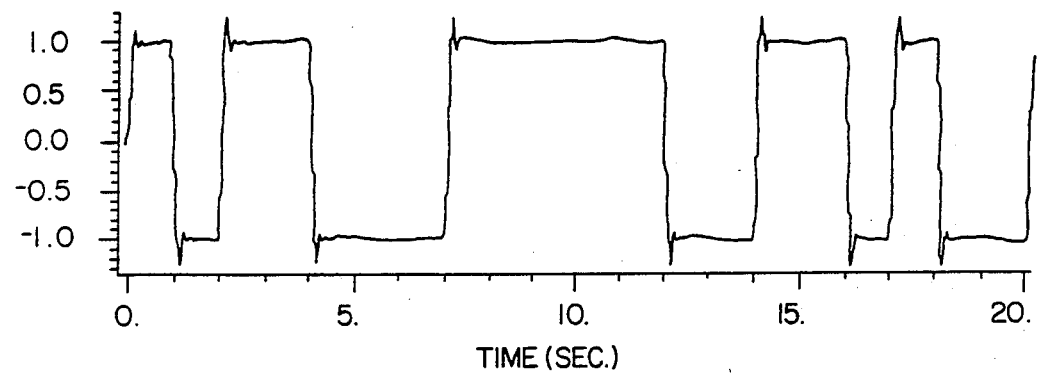
FIG. 3a depicts the baseband waveform of the output of the lowpass filter included in FIG. 2.
Figure 3B:
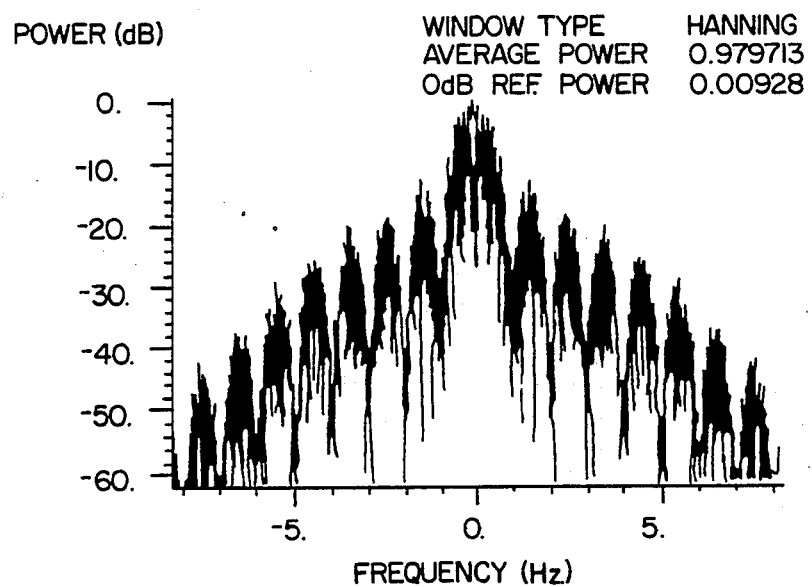

To gain a better understanding of manner in which the invention operates in a PSK modulation scheme, the modulation and demodulation steps were simulated in a computer simulation system, as shown in simplified form in FIG. 2. Pulse code modulation (PCM) pulses were generated, as indicated in block 40, and input to a low-pass filter 42, the purpose of which is to give the pulses a rise and fall time of about 0.1 T, where T is the time between data bits. The data bits consist of ±1 pulses, and the filter 42 is a fourth-order filter of the Butterworth type, chosen such that BT = 5, where B is the 3 dB bandwidth of the filter. FIG. 3a shows the input PCM pulses in the time domain after bandlimiting by the lowpass filter 42, and FIG. 3b shows the magnitude spectrum of the same signal.

Figure 4:
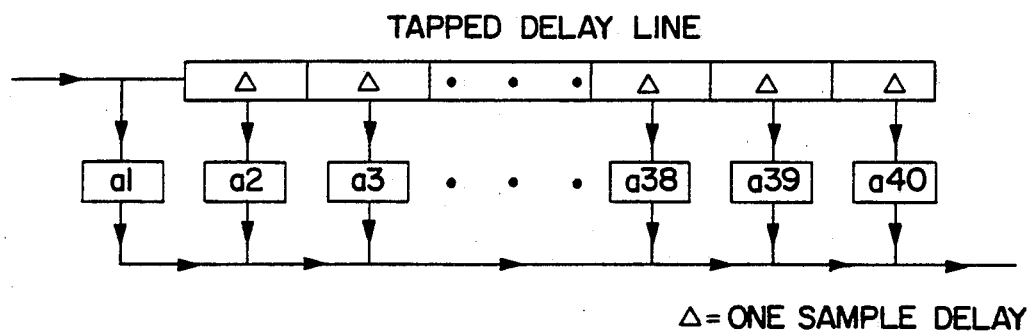
FIG. 4 is a schematic view of a derivative filter in the form of a finite impulse response (FIR) filter.
Figure 5A:
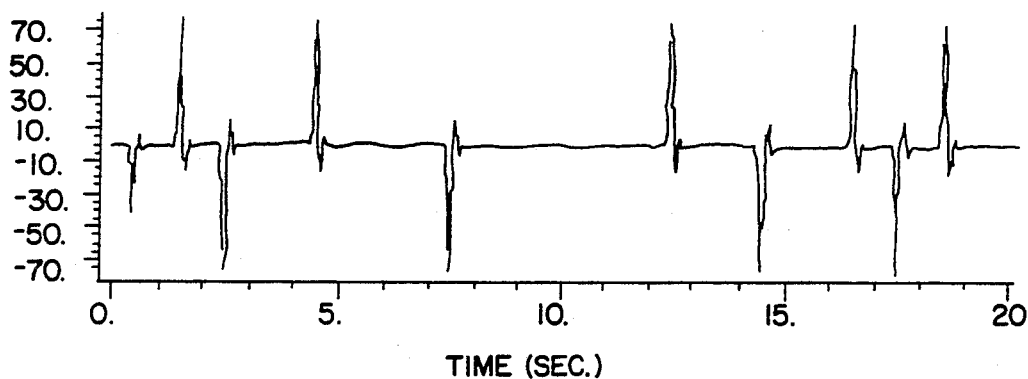
FIG. 5a depicts the output of the derivative filter of FIG. 2.
Figure 5B:
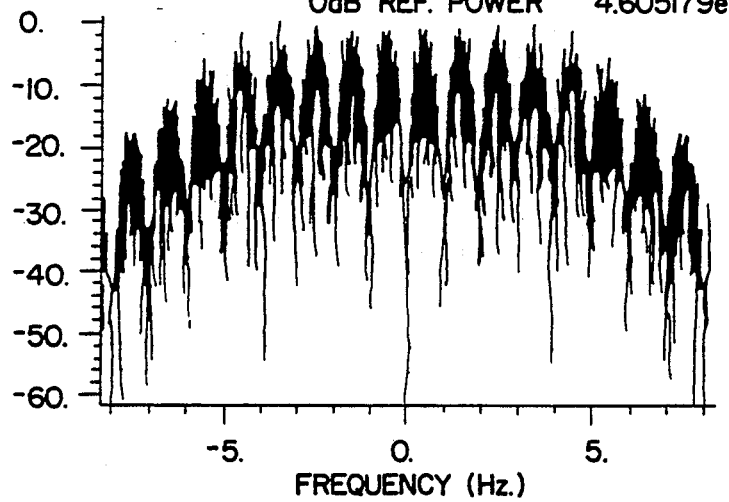

Next the signals from the filter 42 are input to the derivative filter, here indicated as 14'. The derivative filter in the simulation was implemented as a digital optimal equiripple filter, designed using the Parks-McClellan algorithm, and taking the form of a 40-tap FIR structure as shown in FIG. 4. The time waveform after passing the bandlimited data pulses through the derivative filter 14' is shown in FIG. 5a. Consistent with the notion of time differentiation, transitions between signal levels of the original data are represented in FIG. 5a by spikes in the output of the derivative filter 14'. The magnitude spectrum of the derivative filter output signals is shown in FIG. 5b.

Figure 6A:
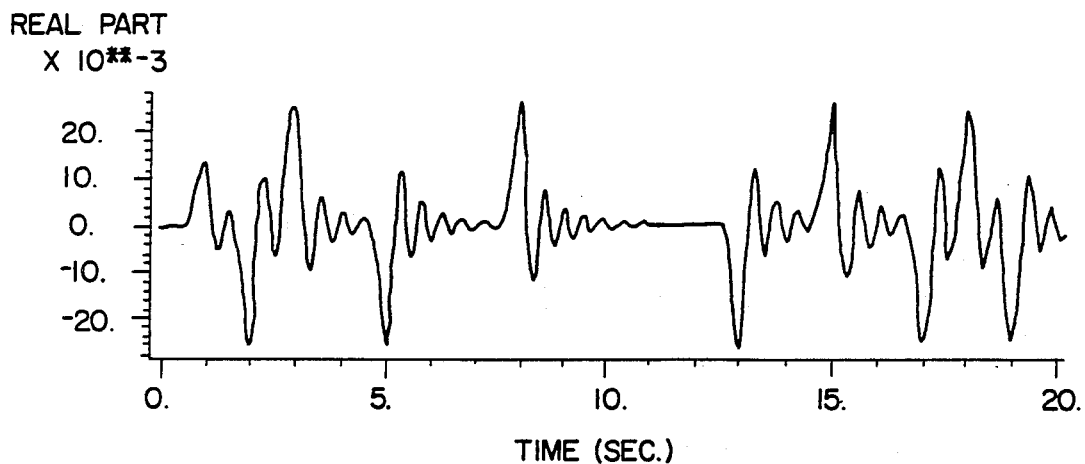
FIG. 6a depicts the waveform of a second lowpass filter in FIG. 2.
Figure 6B:
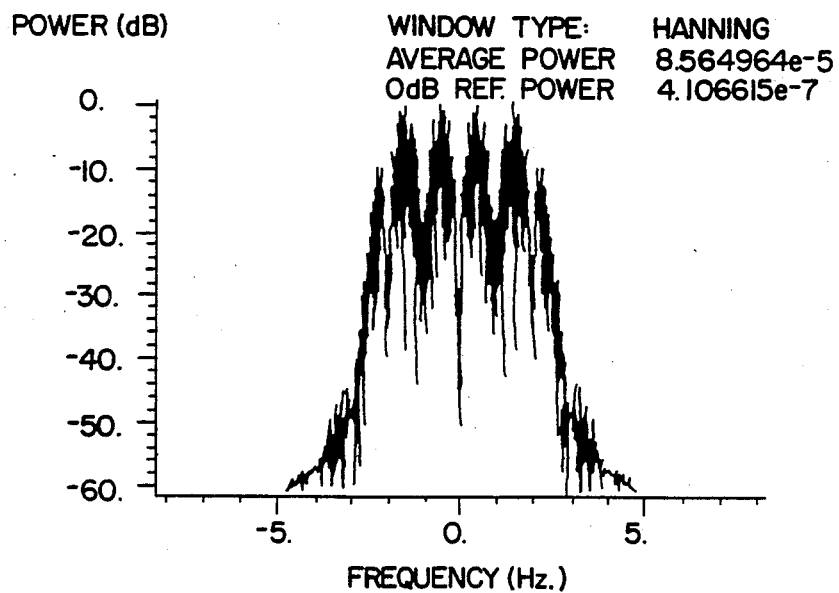

A second lowpass filter 44 is placed after the derivative filter, in the simulation, to simulate the effects of a real bandwidth-limited frequency modulator. The waveform after filter 44 is shown in FIG. 6a, for a filter bandwidth such that BT = 2. It can be seen from FIG. 6a that the derivative spikes of FIG. 5a have been broadened and flattened by the presence of the filter 44. The corresponding magnitude spectrum is shown again, in FIG. 6b.

Figure 7A:
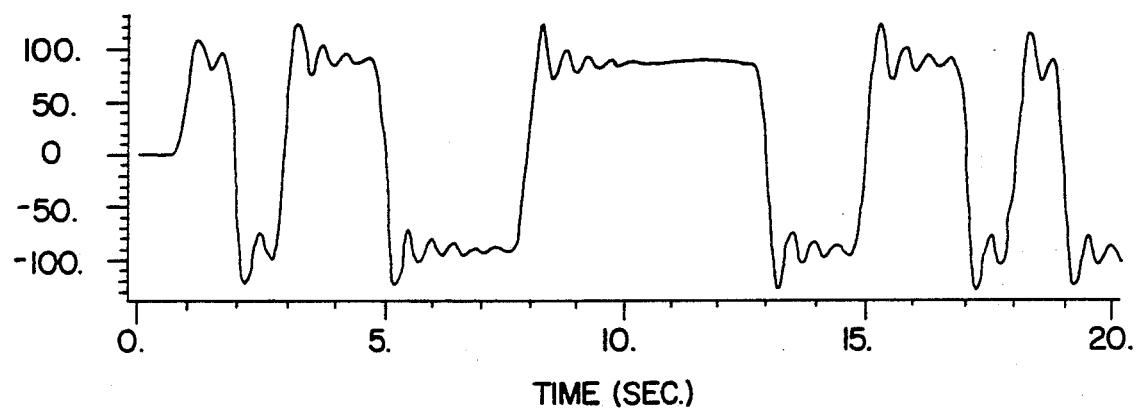
FIG. 7a depicts the output of the frequency modulator of FIG. 2.
Figure 7B:
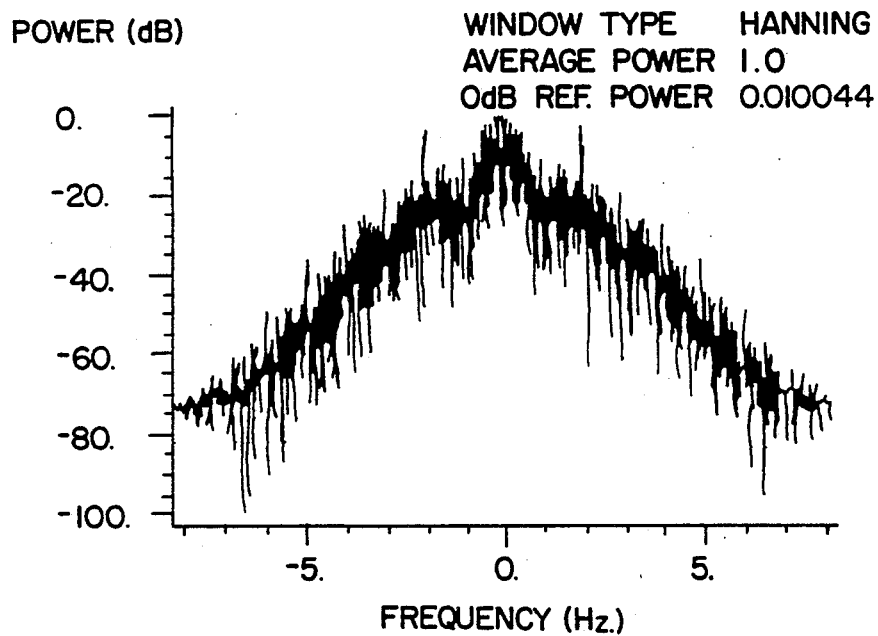

The bandlimited derivative filter output is finally transmitted to an ideal frequency modulator 46, and the resultant output is shown in FIG. 7a. Because of the simulation technique employed, the output is shown at baseband rather than at carrier frequency. Thus, the phase variations show again as basically binary transitions between ±1. The corresponding magnitude spectrum is shown in FIG. 7b.

Figure 8A:
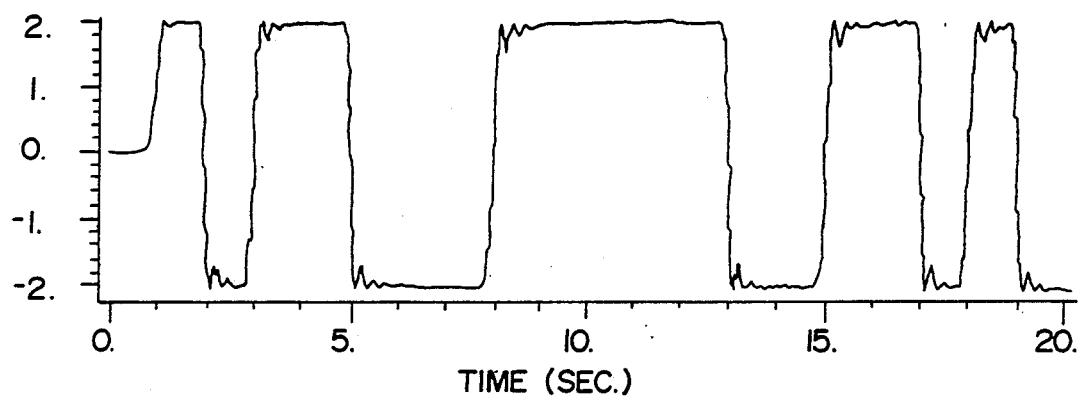
FIG. 8a depicts the output PSK demodulator of FIG. 2, and shows the reconstructed PSK data signal.
Figure 8B:
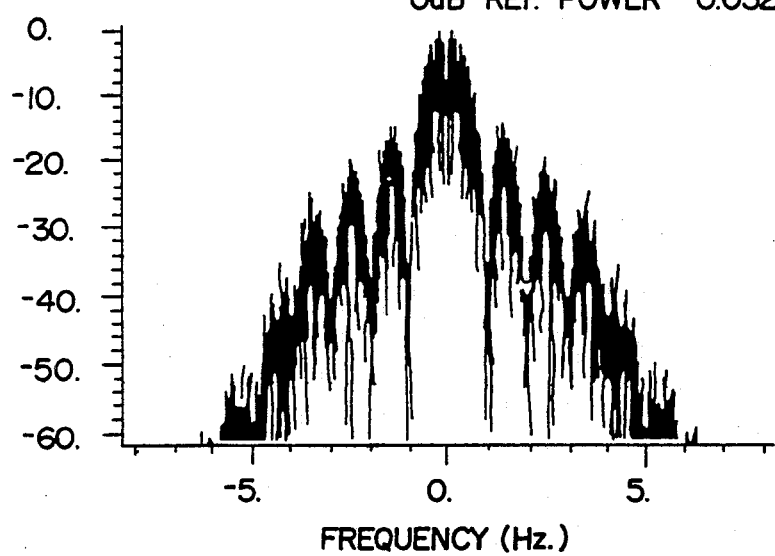

The frequency modulator output is transmitted to a PSK demodulator 48 which recovers the original data signals again, as shown in FIG. 8a, with the corresponding magnitude spectrum shown in FIG. 8b.

From the foregoing description, it will be appreciated that the present invention represents a significant advance in the field of optical phase modulation techniques. In brief, the invention achieves direct optical phase modulation of a laser diode by means of a relatively inexpensive electrical filter, thereby avoiding the problems inherent in the use of a bulky, expensive, and less reliable electro-optical modulator. It will also be appreciated that, although an embodiment of the invention has been described in detail for purposes of illustration, various modifications may be made without departing from the spirit and scope of the invention. Accordingly, the invention is not to be limited except as by the appended claims.

I claim:

1. A method of optical phase modulation, comprising the steps of:
    differentiating a time-varying input data signal with respect to time;
    generating an optical carrier signal in a laser diode; and
    modulating the optical carrier signal with the time-differentiated, data signal, whereby the laser diode operates to frequency-modulate the time-differentiated data signal, which is equivalent to phase modulation of the data signal.

2. A method as defined in claim 1, and further comprising the step of:
    equalizing the differentiated data signal prior to the modulating steps to compensate for nonlinearities in operation of the laser diode as a frequency modulator.

3. An optical phase modulation apparatus, comprising:
    a laser diode generating an optical carrier signal;
    a derivative filter connected to receive a time-varying data signal as input, and to produce an output signal proportional to the time derivative of the input data signal; and
    means for coupling the derivative filter output signal to the laser diode, wherein the laser diode functions as a frequency modulator and produces a modulated optical carrier signal that is modulated in phase variations in the input data signal.

4. An optical phase modulation apparatus as defined in claim 3, and further including:
    an equalizing filter connected between the derivative filter and the laser diode, to compensate for nonlinearities in operation of the laser diode as a frequency modulator.

5. An optical phase modulation apparatus as defined in claim 4, wherein:
    the equalizing filter includes a resistance-capacitance (R-C) circuit.

6. An optical phase modulation apparatus as defined in claim 4, wherein:
    the derivative filter is a finite impulse response (FIR) filter.

7. An optical communication system, comprising:
    a laser diode, generating an optical carrier signal;
    a derivative filter connected to receive a data signal as input, in the form of digital data pulses, and to produce an output signal proportional to the time derivative of the input data signal;
    means for coupling the derivative filter output signal to the laser diode, wherein the laser diode functions as a frequency modulator and produces a modulated carrier signal that is modulated in phase by $+90°$ and $-90°$ variations in the input data signal;
    means for transmitting the modulated optical carrier signal through a transmission medium; and
    demodulation means, for recovering the data signal.

8. An optical communication system as defined in claim 7, wherein:
    the data signal takes the form of phase-shift keying (PSK) data pulses.

* * * * *